US008278687B2

(12) United States Patent
Pillarisetty et al.

(10) Patent No.: US 8,278,687 B2
(45) Date of Patent: Oct. 2, 2012

(54) SEMICONDUCTOR HETEROSTRUCTURES TO REDUCE SHORT CHANNEL EFFECTS

(75) Inventors: Ravi Pillarisetty, Portland, OR (US); Mantu K. Hudait, Portland, OR (US); Marko Radosavljevic, Beaverton, OR (US); Gilbert Dewey, Hillsboro, OR (US); Titash Rakshit, Hillsboro, OR (US); Robert S. Chau, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 484 days.

(21) Appl. No.: 12/058,101

(22) Filed: Mar. 28, 2008

(65) Prior Publication Data

US 2009/0242873 A1    Oct. 1, 2009

(51) Int. Cl.
*H01L 29/778* (2006.01)
(52) U.S. Cl. ......... 257/194; 257/E29.246; 257/E29.247; 257/E29.248; 257/E29.249
(58) Field of Classification Search .................... 257/194
See application file for complete search history.

(56) References Cited

U.S. PATENT DOCUMENTS

| | | | |
|---|---|---|---|
| 5,783,478 A | 7/1998 | Chau et al. | |
| 6,373,112 B1 | 4/2002 | Murthy et al. | |
| 6,537,865 B2* | 3/2003 | Inokuchi et al. | 438/172 |
| 6,621,131 B2 | 9/2003 | Murthy et al. | |
| 6,645,831 B1 | 11/2003 | Shaheen et al. | |
| 6,706,574 B2* | 3/2004 | Brar | 438/167 |
| 6,797,556 B2 | 9/2004 | Murthy et al. | |
| 6,812,086 B2 | 11/2004 | Murthy et al. | |
| 6,825,506 B2 | 11/2004 | Chau et al. | |
| 6,858,478 B2 | 2/2005 | Chau et al. | |
| 6,861,318 B2 | 3/2005 | Murthy et al. | |
| 6,885,084 B2 | 4/2005 | Murthy et al. | |
| 6,887,395 B2 | 5/2005 | Hareland et al. | |
| 6,897,098 B2 | 5/2005 | Hareland et al. | |
| 6,900,481 B2 | 5/2005 | Jin et al. | |
| 6,909,151 B2 | 6/2005 | Hareland et al. | |
| 6,914,295 B2 | 7/2005 | Chau et al. | |
| 6,933,589 B2 | 8/2005 | Murthy et al. | |
| 6,972,228 B2 | 12/2005 | Doyle et al. | |

(Continued)

OTHER PUBLICATIONS

Shaheen, Mohamad et al., "High Mobility Tri-Gate Devices and Mathods of Fabrication", U.S. Patent Application filed Dec. 1, 2006 assigned U.S. Appl. No. 11/332,189.

(Continued)

*Primary Examiner* — Jerome Jackson, Jr.
(74) *Attorney, Agent, or Firm* — Cool Patent, P.C.; Joseph P. Curtin

(57) ABSTRACT

Semiconductor heterostructures to reduce short channel effects are generally described. In one example, an apparatus includes a semiconductor substrate, one or more buffer layers coupled to the semiconductor substrate, a first barrier layer coupled to the one or more buffer layers, a back gate layer coupled to the first barrier layer wherein the back gate layer includes a group III-V semiconductor material, a group II-VI semiconductor material, or combinations thereof, the back gate layer having a first bandgap, a second barrier layer coupled to the back gate layer wherein the second barrier layer includes a group III-V semiconductor material, a group II-VI semiconductor material, or combinations thereof, the second barrier layer having a second bandgap that is relatively larger than the first bandgap, and a quantum well channel coupled to the second barrier layer, the quantum well channel having a third bandgap that is relatively smaller than the second bandgap.

10 Claims, 5 Drawing Sheets

U.S. PATENT DOCUMENTS

| | | | |
|---|---|---|---|
| 6,974,733 | B2 | 12/2005 | Boyanov et al. |
| 6,974,738 | B2 | 12/2005 | Hareland et al. |
| 7,005,366 | B2 | 2/2006 | Chau et al. |
| 7,042,009 | B2 | 5/2006 | Shaheen et al. |
| 7,105,390 | B2 | 9/2006 | Brask et al. |
| 7,138,316 | B2 | 11/2006 | Jin et al. |
| 7,145,246 | B2 | 12/2006 | Hareland et al. |
| 7,176,075 | B2 | 2/2007 | Chau et al. |
| 7,180,109 | B2 | 2/2007 | Chau et al. |
| 7,193,279 | B2 | 3/2007 | Doyle et al. |
| 7,235,809 | B2 | 6/2007 | Jin et al. |
| 7,241,653 | B2 | 7/2007 | Hareland et al. |
| 7,268,058 | B2 | 9/2007 | Chau et al. |
| 7,279,375 | B2 | 10/2007 | Radosavljevic et al. |
| 7,285,829 | B2 | 10/2007 | Doyle et al. |
| 7,358,121 | B2 | 4/2008 | Chau et al. |
| 7,494,911 | B2 * | 2/2009 | Hudait et al. .......... 438/604 |
| 2004/0113210 | A1 | 6/2004 | Chau et al. |
| 2004/0191980 | A1 | 9/2004 | Rios et al. |
| 2004/0245536 | A1 * | 12/2004 | Kushibe et al. .......... 257/94 |
| 2005/0124125 | A1 | 6/2005 | Jin et al. |
| 2006/0141682 | A1 * | 6/2006 | Taylor et al. .......... 438/142 |
| 2007/0123003 | A1 | 5/2007 | Brask et al. |
| 2008/0029756 | A1 | 2/2008 | Hudait et al. |
| 2008/0032478 | A1 | 2/2008 | Hudait et al. |
| 2008/0073639 | A1 | 3/2008 | Hudait et al. |
| 2008/0076235 | A1 | 3/2008 | Hudait et al. |
| 2008/0079003 | A1 | 4/2008 | Shaheen et al. |
| 2008/0079094 | A1 | 4/2008 | Jin et al. |
| 2008/0085580 | A1 | 4/2008 | Doyle et al. |

OTHER PUBLICATIONS

Jin, Been Y., et al., "Non-Planar PMOS Structure with a Strained Channel Region and an Integrated Strained CMOS Flow", U.S. Patent Application filed Dec. 20, 2007 assigned U.S. Appl. No. 12/004,706.

Jin, Been Y., et al., "Mechanism for Forming a Remote Delta Doping Layer of a Quantum Well Structure", U.S. Patent Application filed Mar. 29, 2007 assigned U.S. Appl. No. 11/731,266.

Dutta, Suman et al., "Strain-Inducing Semiconductor Regions", U.S. Patent Application filed Jun. 9, 2006 assigned U.S. Appl. No. 11/450,745.

Hudait, Mantu et al., "SB-Based CMOS Device", U.S. Patent Application filed Nov. 16, 2006 assigned U.S. Appl. No. 11/560,494.

Shaheen, Mohamad et al., "Thin III-V Semiconductor Films with High Electron Mobility", U.S. Patent Application filed Dec. 4, 2006 assigned U.S. Appl. No. 11/633,953.

Kavalieros, Jack T., et al., "An Apparatus and Method for Selectively Recessing Spacers on Multi-Gate Devices", U.S. Patent Application filed Sep. 15, 2006 assigned U.S. Appl. No. 11/521,624.

Hudait, Mantu et al., "Improved Dopant Confinement in the Delta Doped Layer using a Dopant Segregation Barrier in Quantum Well Structures", U.S. Patent Application filed Dec. 29, 2006 assigned U.S. Appl. No. 11/647,989.

Dutta, Suman et al., "Insulated Gate for Group III-V Devices", U.S. Patent Application filed Dec. 13, 2006 assigned U.S. Appl. No. 11/610,415.

Shah, Uday et al., "CMOS Structure and Method of Manufacturing Same", U.S. Patent Application filed Mar. 30, 2007 assigned U.S. Appl. No. 11/731,163.

Doyle, Brian et al., "Multi-Gate Structure and Method of Doping Same", U.S. Patent Application filed Mar. 28, 2007 assigned U.S. Appl. No. 11/729,198.

Hudait, Mantu et al., "A Buffer Architecture formed on a Semiconductor Wafer", U.S. Patent Application filed Mar. 1, 2007 assigned U.S. Appl. No. 11/712,614.

Hudait, Mantu et al., "Forming Arsenide-Based Complementary Logic on a Single Substrate", U.S. Patent Application filed Feb. 28, 2007 assigned U.S. Appl. No. 11/712,191.

Chui, Chi O., et al., "Forming a Type I Heterostructure in a Group IV Semiconductor", U.S. Patent Application filed Mar. 27, 2007 assigned U.S. Appl. No. 11/728,890.

Chui, Chi O., et al., "Forming a Non-Planar Transistor having a Quantum Well Channel", U.S. Patent Application filed Mar. 27, 2007 assigned U.S. Appl. No. 11/728,891.

Jin, Been Y., et al., "Transistor having Tensile Strained Channel and System Including Same", U.S. Patent Application filed Mar. 29, 2007 assigned U.S. Appl. No. 11/729,564.

Jin, Been Y., et al., "Method to Introduce Uniaxial Strain in Multigate Nanoscale Transistors by Self Aligned SI to SIGE Conversion Processes and Structures Formed Thereby", U.S. Patent Application filed Sep. 28, 2007 assigned U.S. Appl. No. 11/864,726.

Jin, Been Y., et al., "Silicon Germanium and Germanium Multigate and Nanowire Structures for Logic and Multilevel Memory Applications", U.S. Patent Application filed Mar. 29, 2007 assigned U.S. Appl. No. 11/729,565.

Hudait, Mantu et al., "High Hole Mobility Semiconductor Device", U.S. Patent Application filed Jun. 28, 2007 assigned U.S. Appl. No. 11/823,516.

Jin, Been Y., et al., "Three Dimensional Quantum Dot Array", U.S. Patent Application filed Jun. 28, 2007 assigned U.S. Appl. No. 11/823,758.

Pillarisetty, Ravi et al., "Apparatus and Methods for Improving Multi-Gate Device Performance", U.S. Patent Application filed Mar. 14, 2008 assigned U.S. Appl. No. 12/049,078.

* cited by examiner

SEMICONDUCTOR HETEROSTRUCTURES TO REDUCE SHORT CHANNEL EFFECTS

BACKGROUND

Generally, semiconductor thin films comprising group III-V semiconductor materials are emerging as material structures upon which transistors may be formed for electronic or optoelectronic devices.

BRIEF DESCRIPTION OF THE DRAWINGS

Embodiments disclosed herein are illustrated by way of example, and not by way of limitation, in the figures of the accompanying drawings in which like reference numerals refer to similar elements and in which.

Figure 1:
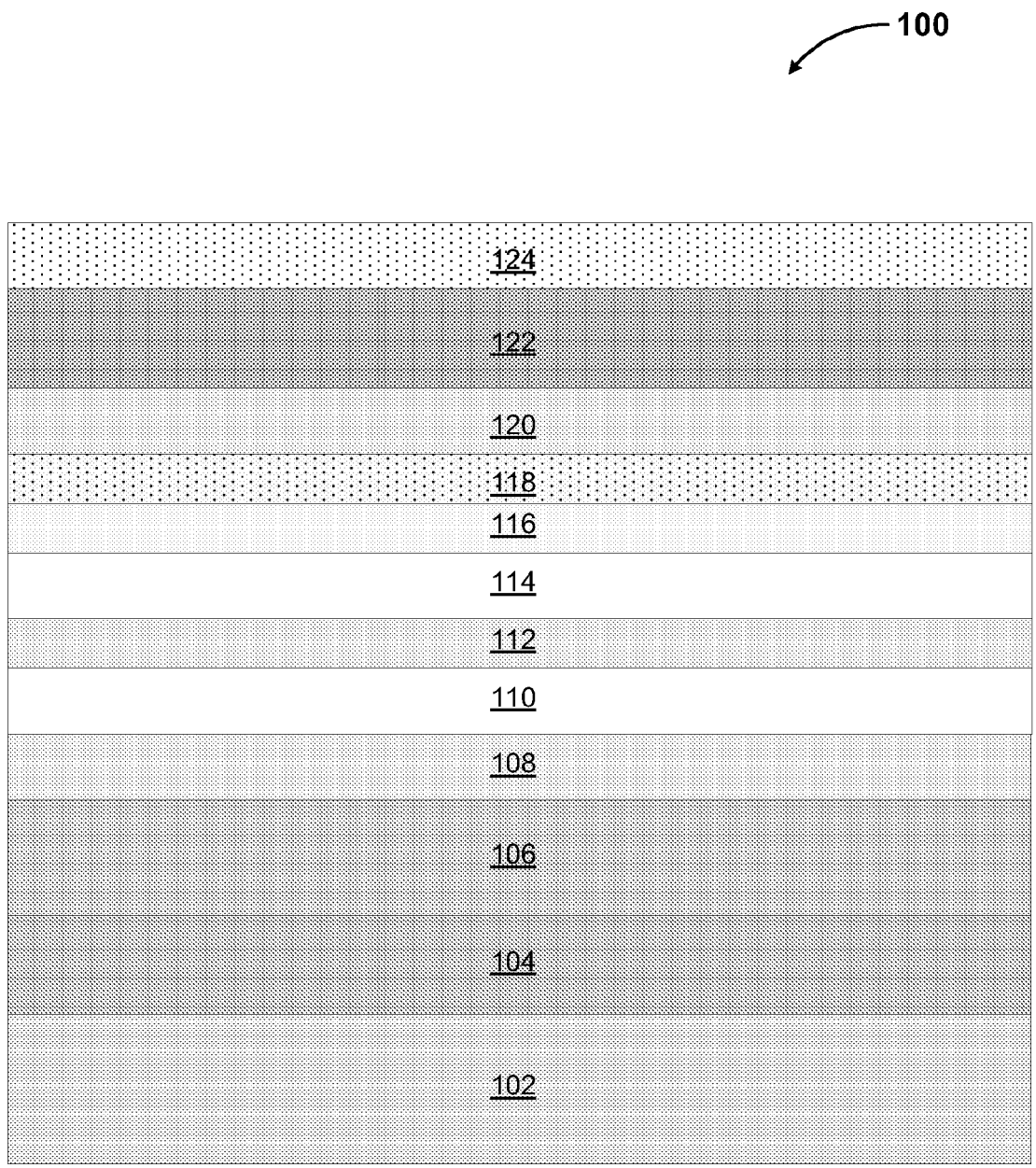
FIG. 1 is an elevation cross-section schematic of a semiconductor heterostructure comprising a back gate layer, according to but one embodiment.

For simplicity and/or clarity of illustration, elements illustrated in the figures have not necessarily been drawn to scale. For example, the dimensions of some of the elements may be exaggerated relative to other elements for clarity. Further, if considered appropriate, reference numerals have been repeated among the figures to indicate corresponding and/or analogous elements.

DETAILED DESCRIPTION

Embodiments of semiconductor heterostructures to reduce short-channel effects are described herein. In the following description, numerous specific details are set forth to provide a thorough understanding of embodiments disclosed herein. One skilled in the relevant art will recognize, however, that the embodiments disclosed herein can be practiced without one or more of the specific details, or with other methods, components, materials, and so forth. In other instances, well-known structures, materials, or operations are not shown or described in detail to avoid obscuring aspects of the specification.

Reference throughout the specification to "one embodiment" or "an embodiment" means that a particular feature, structure or characteristic described in connection with the embodiment is included in at least one embodiment. Thus, appearances of the phrases "in one embodiment" or "in an embodiment" in various places throughout the specification are not necessarily referring to the same embodiment. Furthermore, the particular features, structures or characteristics may be combined in any suitable manner in one or more embodiments.

FIG. 1 is an elevation cross-section schematic of a semiconductor heterostructure comprising a back gate layer, according to but one embodiment. In an embodiment, a semiconductor heterostructure 100 includes a semiconductor substrate 102, a buffer layer 104, a graded buffer layer 106, a first barrier layer 108, a back gate layer 110, a second barrier layer 112, and a quantum well channel 114, coupled as shown. In another embodiment, a semiconductor heterostructure 100 further includes a spacer layer 116, a doped layer 118, a third barrier layer 120, an etch stop layer 122, and a contact layer 124, coupled as shown. In other embodiments, a semiconductor heterostructure 100 includes more or less layers or structures than depicted.

Electronic devices, such as transistors, formed in semiconductor heterostructure 100 may have higher carrier mobility than conventional silicon transistors. Higher carrier mobility in a semiconductor heterostructure 100 may result from reduced impurity scattering due to doped layer 118 and/or a relatively lower effective mass compared to conventional silicon transistors. In an embodiment, semiconductor heterostructure 100 comprises group III-V semiconductor materials and/or group II-VI semiconductor materials or other suitable materials.

A semiconductor heterostructure 100 may include a back gate layer 110 and a second barrier layer 112 disposed between the back gate layer 110 and a quantum-well channel 114. Back gate layer 110 may allow modulation of the carrier density in the quantum-well channel 114, which may result in increased electrostatic control of the quantum-well channel 114. A back gate layer 110 as described herein may reduce short-channel effects, allow gate length ($L_g$) scaling, or combinations thereof, in an electronic device such as a quantum-well transistor that incorporates the back gate layer 110.

Semiconductor heterostructure 100 may be used to form n-type metal-oxidesemiconductor (NMOS) or p-type metal-oxide-semiconductor (PMOS) devices including, for example, logic, analog, or memory devices, or combinations thereof. In an embodiment, a semiconductor heterostructure 100 includes a semiconductor substrate 102. A semiconductor substrate 102 may include n-type or p-type (100) off-oriented silicon, the crystalline directions of the substrate 102 being symbolized by the convention (xyz), in which x, y, and z are crystallographic planes in three dimensions that are perpendicular to one another. In an embodiment, semiconductor substrate 102 includes material of a (100) direction off-cut in a range between about 2 degrees to about 8 degrees towards a (110) direction. In other embodiments, other off-cut orientations or a substrate 102 without an off-cut orientation may be used. In another embodiment, semiconductor substrate 102 has a high resistivity between about 1 R-cm to about 50 kR-cm. A high-resistivity substrate 102 may provide for device isolation and off-cutting may eliminate anti-phase domains in anti-phase boundaries.

One or more buffer layers 104, 106 may be coupled to the semiconductor substrate 102. In an embodiment, one or more buffer layers 104, 106 comprise a nucleation buffer layer 104 and a graded buffer layer 106. A nucleation buffer layer 104 comprises gallium arsenide (GaAs) in one embodiment. Other material systems may be used to form nucleation buffer layer 104 including NMOS or PMOS material systems. In an embodiment, a nucleation buffer layer 104 is used to fill semiconductor substrate 102 terraces with atomic bi-layers of a semiconductor material including, for example, one or more group III-V semiconductor materials and/or one or more group II-VI semiconductor materials, or combinations thereof. A nucleation portion of nucleation buffer layer 104 may create a virtual polar substrate 102. Such nucleation portion may have a thickness of about 3 nanometers (nm) to about 50 nm in one or more embodiments. A buffer layer portion of nucleation buffer layer 104 may serve as a buffer against dislocation threading and/or provide control of a lattice mismatch of about 4% to about 8% between a semiconductor substrate 102 and a first barrier layer 108. The buffer layer portion of nucleation buffer layer 104 may have a thickness of about 0.3 microns to about 5 microns, in one or more embodiments.

A graded buffer layer 106 may be coupled to a nucleation buffer layer 104. Graded buffer layer 106 may comprise group III-V semiconductor materials and/or group II-VI semiconductor materials, or combinations thereof, including, for example, indium aluminum arsenide ($In_xAl_{1-x}As$), in which x has a value between 0 and 1, representing the relative composition of the elements. In one embodiment, x comprises values between about 0 and about 0.52. In another embodiment, graded buffer layer 106 comprises indium aluminum antimonide (InAlSb). Other material systems including NMOS or PMOS materials may be used for graded buffer layer 106 in other embodiments. Graded buffer layer 106 may have a thickness of about 0.5 microns to 2 microns in various embodiments. In an embodiment, graded buffer layer 106 comprises inverse graded InAlAs or indium gallium aluminum arsenide (InGaAlAs) to provide a larger bandgap for device isolation. Increasing the relative percentage of aluminum (Al) in the graded buffer layer 106 may increase strain to quantum-well channel 114. A graded buffer layer 106 may also provide stress relaxation between semiconductor substrate 102 and other lattice mismatched layers,. such as, for example, first barrier layer 108.

Together, nucleation buffer layer 104 and graded buffer layer 106 may form a dislocation filtering buffer. One or more buffer layers 104, 106 may provide compressive strain for a quantum-well channel 114. One or more buffer layers 104, 106 may further provide a buffer for lattice control mismatch between semiconductor substrate 102 and other layers, such as first barrier layer 108, to reduce threading dislocation defects in semiconductor heterostructure 100. More or less buffer layers 104, 106, other buffer layers, or techniques that provide similar function as buffer layers 104, 106 may be used in other embodiments. In an embodiment, one or more buffer layers 104, 106 are deposited by molecular beam epitaxy (MBE), atomic layer epitaxy (ALE), epitaxial growth, chemical beam epitaxy (CBE), metal-organic chemical vapor deposition (MOCVD), or combinations thereof. Other suitable deposition methods may be used in other embodiments.

A first barrier layer 108 may be coupled to the one or more buffer layers 104, 106. First barrier layer 108 may comprise group III-V semiconductor materials and/or group II-VI semiconductor materials, or combinations thereof, including, for example, indium aluminum arsenide ($In_xAl_{1-x}As$), in which x has a value between 0 and 1, representing the relative composition of the elements. In an embodiment, x comprises a value between about 0.5 and about 0.8. In another embodiment, a first barrier layer 108 comprises indium aluminum antimonide (InAlSb). Other material systems including NMOS materials and/or PMOS materials may be used for a first barrier layer 108 in other embodiments. First barrier layer 108 may comprise a material that has a higher bandgap than a material used for quantum-well channel 114. First barrier layer 108 may comprise a thickness sufficient to provide a potential barrier to charge carriers in semiconductor heterostructure 100. In an embodiment, first barrier layer 108 has a thickness of about 10 nm to 200 nm.

In an embodiment, first barrier layer 108 is deposited by molecular beam epitaxy (MBE), atomic layer epitaxy (ALE), epitaxial growth, chemical beam epitaxy (CBE), metal-organic chemical vapor deposition (MOCVD), or combinations thereof. Other suitable deposition methods may be used in other embodiments.

A back gate layer 110 may be coupled to the first barrier layer 108. Back gate layer 110 may comprise group III-V semiconductor materials and/or group II-VI semiconductor materials, or combinations thereof, including, for example, indium gallium arsenide ($In_xGa_{1-x}As$), in which x has a value between 0 and 1, representing the relative composition of the elements. In an embodiment, x comprises values between about 0.5 and about 0.8. In another embodiment, back gate layer 110 comprises indium antimonide (InSb). Back gate layer 110 may include various other material systems in other embodiments including NMOS and PMOS materials.

In an embodiment, back gate layer 110 comprises a bandgap that is relatively smaller than a bandgap of a first barrier layer 108. In an embodiment, back gate layer 110 comprises sufficient conductance to allow electrostatic control of the quantum-well channel 114. A back gate layer 110 may have a thickness of about 10 nm to about 1000 nm. In other embodiments, back gate layer 110 may include other thicknesses.

In an embodiment, back gate layer 110 comprises n-type dopants. Back gate layer 110 may be doped with n-type dopants to increase electrical conductivity of the back gate layer 110. According to one embodiment, back gate layer 110 comprises n+, n++ doped material, or combinations thereof. In another embodiment, back gate layer 110 comprises sufficient dopant to allow electric field control across the quantum-well channel 114 via the back gate layer 110. In yet another embodiment, the back gate layer 110 allows modulation of charge carrier density in the quantum-well channel 114 to decrease short-channel effects of an electronic device, such as a transistor. In general, embodiments disclosed herein may allow electric field control across the quantum-well channel 114, modulation of charge carrier density, and/or reduce short-channel effects.

In an embodiment, back gate layer 110 is deposited by molecular beam epitaxy (MBE), atomic layer epitaxy (ALE), epitaxial growth, chemical beam epitaxy (CBE), metal-organic chemical vapor deposition (MOCVD), or combinations thereof. Other suitable deposition methods may be used in other embodiments.

A second barrier layer 112 may be coupled to the back gate layer 110. Second barrier layer 112 may comprise group III-V semiconductor materials and/or group II-VI semiconductor materials, or combinations thereof, including, for example, indium aluminum arsenide (InAlAs), aluminum arsenide (AlAs), indium aluminum antimonide (InAlSb), or combinations thereof. A second barrier layer 112 may include various other material systems,. such as NMOS or PMOS materials in other embodiments. In an embodiment, second barrier layer 112 comprises a bandgap that is relatively larger than a bandgap of a back gate layer 110. Second barrier layer 112 may comprise a bandgap that is relatively larger than a bandgap of a quantum-well channel 114.

Second barrier layer 112 may provide electrical isolation between back gate layer 110 and quantum-well channel 114. In an embodiment, second barrier layer 112 comprises a bandgap that is sufficient to suppress or prevent electron tunneling or leakage, or combinations thereof, between the quantum-well channel 114 and the back gate layer 110. In one embodiment, a second barrier layer 112 comprises a thickness of about 1 nm to about 30 nm. A second barrier layer 112 may comprise other thicknesses in other embodiments.

In an embodiment, second barrier layer 112 is deposited by molecular beam epitaxy (MBE), atomic layer epitaxy (ALE), epitaxial growth, chemical beam epitaxy (CBE), metal-organic chemical vapor deposition (MOCVD), or combinations thereof. Other suitable deposition methods may be used in other embodiments.

A quantum-well channel 114 may be coupled to the second barrier layer 112. Quantum-well channel 114 may comprise group III-V semiconductor materials and/or group II-VI semiconductor materials, or combinations thereof, including, for example, indium gallium arsenide ($In_xGa_{1-x}As$), in which x has a value between 0 and 1, representing the relative composition of the elements. In an embodiment, x comprises values between about 0.5 and about 0.8. In another embodiment, quantum-well channel 114 comprises indium antimonide (InSb). A quantum-well channel 114 may include various other material systems including NMOS or PMOS materials in other embodiments. In an embodiment, quantum-well channel 114 comprises a bandgap that is relatively smaller than a bandgap for a second barrier layer 112. Quantum-well channel 114 may provide high electron mobility and velocity for NMOS devices and/or provide high hole mobility and velocity for PMOS devices compared to a Si-based device.

In an embodiment, quantum-well channel 114 comprises a thickness that provides sufficient channel conductance for an electronic device, such as a transistor. A quantum-well channel 114 may have a thickness of about 2 nm to about 15 nm. In other embodiments, quantum-well channel 114 comprises other thicknesses. In an embodiment, quantum-well channel 114 is deposited by molecular beam epitaxy (MBE), atomic layer epitaxy (ALE), epitaxial growth, chemical beam epitaxy (CBE), metal-organic chemical vapor deposition (MOCVD), or combinations thereof. Other suitable deposition methods may be used in other embodiments.

Semiconductor heterostructure 100 may further include a spacer layer 116 coupled to the quantum-well channel 114. Spacer layer 116 may provide carrier confinement and/or reduce interaction between a doped layer 118 and quantum-well channel 114. Spacer layer 116 may comprise group III-V semiconductor materials and/or group II-VI semiconductor materials, or combinations thereof, including, for example, indium aluminum arsenide ($In_xAl_{1-x}As$), in which x comprises a value between 0 and 1, representing the relative composition of the elements. In an embodiment, x comprises values between about 0.5 and about 0.8. In another embodiment, spacer layer 116 comprises indium aluminum antimonide (InAlSb). Other material systems may be used to form spacer layer 116 including NMOS or PMOS materials systems.

Spacer layer 116 may comprise a thickness of about 2 nm to 15 nm and may include other thicknesses in other embodiments. Spacer layer 116 may further provide strain to the quantum-well channel 114. For example, in an embodiment in which spacer layer 116 comprises InAlAs or InAlSb, an increase in the relative percentage of Al in the spacer layer 116 may increase strain in the quantum-well channel 114. In an embodiment, spacer layer 116 is deposited by molecular beam epitaxy (MBE), atomic layer epitaxy (ALE), epitaxial growth, chemical beam epitaxy (CBE), metal-organic chemical vapor deposition (MOCVD), or combinations thereof. Other suitable deposition methods may be used in other embodiments.

A doped layer 118 may be coupled to the spacer layer 116. Doped layer 118 may be delta-doped, modulation doped and/or combinations thereof. In an embodiment, doped layer 118 comprises a semiconductor material. For an NMOS device, doped layer 118 may be doped with silicon (Si), tellurium (Te), or combinations thereof. For a PMOS device, doped layer 118 may be doped with beryllium (Be), carbon (C), or combinations thereof. Other impurities may be used in doped layer 118 in other embodiments. In an embodiment, doped layer 118 comprises a thickness of about 3 Ångstroms to about 5 Ångstroms. Other thicknesses for doped layer 118 may be used in other embodiments.

A third barrier layer 120 may be coupled to the doped layer 118. Third barrier layer 120 may comprise group III-V semiconductor materials and/or group II-VI semiconductor materials, or combinations thereof, including, for example, indium aluminum arsenide ($In_xAl_{1-x}As$), in which x has a value between 0 and 1, representing the relative composition of the elements. In an embodiment, x comprises a value between about 0.5 and about 0.8. In another embodiment, third barrier layer 120 comprises InAlSb. Other material systems including NMOS materials and/or PMOS materials may be used for a third barrier layer 120 in other embodiments. Third barrier layer 120 may comprise a material that has a higher bandgap than a material used for quantum-well channel 114. Third barrier layer 120 may comprise a Schottky barrier layer for first or top gate 208 control, which is described in FIG. 2.

In an embodiment, third barrier layer 120 has a thickness of about 2 nm to 15 nm. Other thicknesses for a third barrier layer 120 may be implemented in other embodiments. In an embodiment, third barrier layer 120 is deposited by molecular beam epitaxy (MBE), atomic layer epitaxy (ALE), epitaxial growth, chemical beam epitaxy (CBE), metal-organic chemical vapor deposition (MOCVD), or combinations thereof. Other suitable deposition methods may be used in other embodiments.

An etch stop layer 122 may be coupled to the third barrier layer 120. Etch stop layer 122 may comprise group III-V semiconductor materials and/or group II-VI semiconductor materials, or combinations thereof, including, for example, indium phosphide (InP), InAlSb, or suitable combinations thereof. Other material systems including NMOS materials and/or PMOS materials may be used for etch stop layer 122 in other embodiments.

In an embodiment, etch stop layer 122 may comprise a thickness of about 2 nm to 15 nm. Other thicknesses for etch stop layer 122 may be implemented in other embodiments. In an embodiment, etch stop layer 122 is deposited by molecular beam epitaxy (MBE), atomic layer epitaxy (ALE), epitaxial growth, chemical beam epitaxy (CBE), metal-organic chemical vapor deposition (MOCVD), or combinations thereof. Other suitable deposition methods may be used in other embodiments.

A contact structure 124 may be coupled to the etch stop layer 122. Contact structure 124 may provide source 202 and drain 204 electrodes with low contact resistance. Contact structure 124 may comprise group III-V semiconductor materials and/or group II-VI semiconductor materials, or combinations thereof, including, for example, InGaAs. Other material systems including NMOS materials and/or PMOS materials may be used for contact structure 124 in other embodiments. Contact structure 124 may be doped with impurities to provide sufficient electrical conductivity for first gate 208 functionality.

In an embodiment, contact structure 124 comprises a thickness of about 5 to 50 nm. Other thicknesses of a contact structure 124 may be used in other embodiments. In an embodiment, contact structure 124 is deposited by molecular beam epitaxy (MBE), atomic layer epitaxy (ALE), epitaxial growth, chemical beam epitaxy (CBE), metal-organic chemical vapor deposition (MOCVD), or combinations thereof. Other suitable deposition methods may be used in other embodiments.

Figure 2:
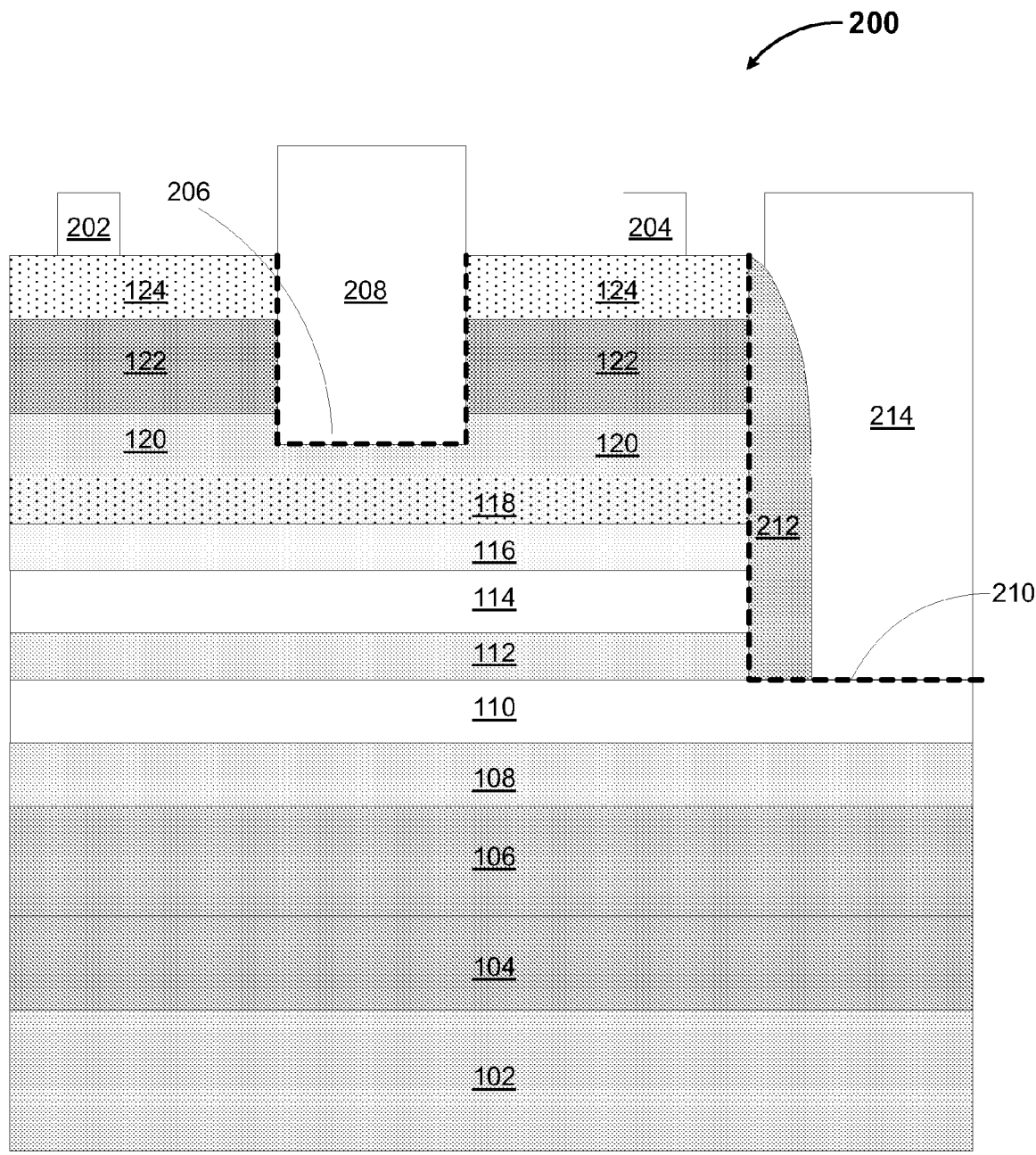
FIG. 2 is an elevation cross-section schematic of an electronic device comprising a semiconductor heterostructure, according to but one embodiment.

FIG. 2 is an elevation cross-section schematic of an electronic device comprising a semiconductor heterostructure, according to but one embodiment. In an embodiment, an electronic device 200 comprises a semiconductor heterostructure 100 comprising a semiconductor substrate 102, a buffer layer 104, a graded buffer layer 106, a first barrier layer 108, a back gate layer 110, a second barrier layer 112, a quantum-well channel 114, a spacer layer 116, a doped layer 118, a third barrier layer 120, an etch stop layer 122, and/or a contact layer 124, coupled as shown. In other embodiments, a semiconductor heterostructure 100 includes more or less layers or structures than depicted. An electronic device 200 may further comprise a source structure 202, a drain structure 204, a first gate electrode structure 208, a spacer dielectric structure 212, and a second gate electrode structure 214, coupled as shown.

An electronic device 200 may comprise a transistor such as, for example, a high electron mobility transistor (HEMT). Electronic device 200 may be formed in and/or on a semiconductor heterostructure 100 as described with respect to FIG. 1. In an embodiment, electronic device 200 comprises a transistor wherein the quantum-well channel 114 is a channel of the transistor and wherein the back gate layer 110 allows modulation of charge carrier density in the quantum-well channel 114 to decrease short-channel effects of the transistor. A source structure 202 and a drain structure 204 may be coupled to the contact structure 124. In an embodiment, source structure 202 and drain structure 204 comprise an electrode material. In another embodiment, a source structure 204 and a drain structure 202 are coupled to the contact structure 124.

A first gate electrode structure 208 may be formed in a first recessed area 206 depicted by dashed line 206. First recessed area 206 may be recessed by etching contact structure 124, etch stop layer 122, and third barrier layer 120. A gate dielectric material (not shown) and a first gate electrode 208 material may be deposited in first recessed area 206 of layers 120, 122, 124. In an embodiment, a first gate electrode structure 208 is coupled to a first recessed area 206 in the third barrier layer 120, the etch stop layer 122, and the contact structure 124. In another embodiment, a first gate electrode 208 is disposed between the source 202 and drain 204 structures. In yet another embodiment, a first gate electrode 208 comprises any suitable electrode material including metals such as aluminum (Al), copper (Cu), gold (Au), or combinations thereof. Third barrier layer 120 may comprise a Schottky barrier layer for first gate electrode structure 208. A Schottky junction may be formed through which first gate electrode structure 208 may control a quantum-well channel 114.

A spacer dielectric structure 212 may be coupled to a second barrier layer 112, a quantum-well channel 114, a spacer layer 116, a doped layer 118, a third barrier layer 120, an etch stop layer 122, and/or a contact layer 124 in a second recessed area 210 depicted by dashed line 210. A second recessed area 210 may be formed by an etch process that removes material down to the back gate layer 110. For example, a hardmask may be patterned to protect regions of electronic device 200 from a recess etch process that forms second recessed area 210. Spacer dielectric 212 material may be deposited and etched to form a spacer dielectric structure 212 that electrically isolates a second gate electrode structure 214 from a quantum-well channel 114. In an embodiment, the spacer dielectric structure 212 is coupled to a second recessed area 210 in the second barrier layer 112, quantum-well channel 114, the spacer layer 116, the doped layer 118, the third barrier layer 120, the etch stop layer 122, and/or the contact structure 124.

A second gate electrode structure 214 may be coupled to the back gate layer 110 and the spacer dielectric structure 212 in the second recessed area 210. Second gate electrode structure 214 may be deposited to be electrically coupled with the back gate layer 210. In an embodiment, second gate electrode 214 comprises any suitable electrode material including metals such as aluminum (Al), copper (Cu), gold (Au), or combinations thereof.

A back gate layer 110 may function as a back gate of electronic device 200 to modulate the carrier density in the quantum-well channel 114. For an n-type electronic device 200, a positive voltage applied through second gate electrode structure 214 to back gate layer 110 increases charge carriers in quantum-well channel 114 according to an embodiment. For a p-type electronic device 200, a negative voltage applied through second gate electrode structure 214 to back gate layer 110 increases charge carriers in quantum-well channel 114. The ability to modulate charge carrier density in quantum-well channel 114 using back gate layer 110 may increase electric field control across quantum-well channel 114. Back gate layer 110 may increase electrostatic control or reduce short-channel effects of electronic device 200 allowing for potential gate length scaling of electronic device 200.

Figure 3:
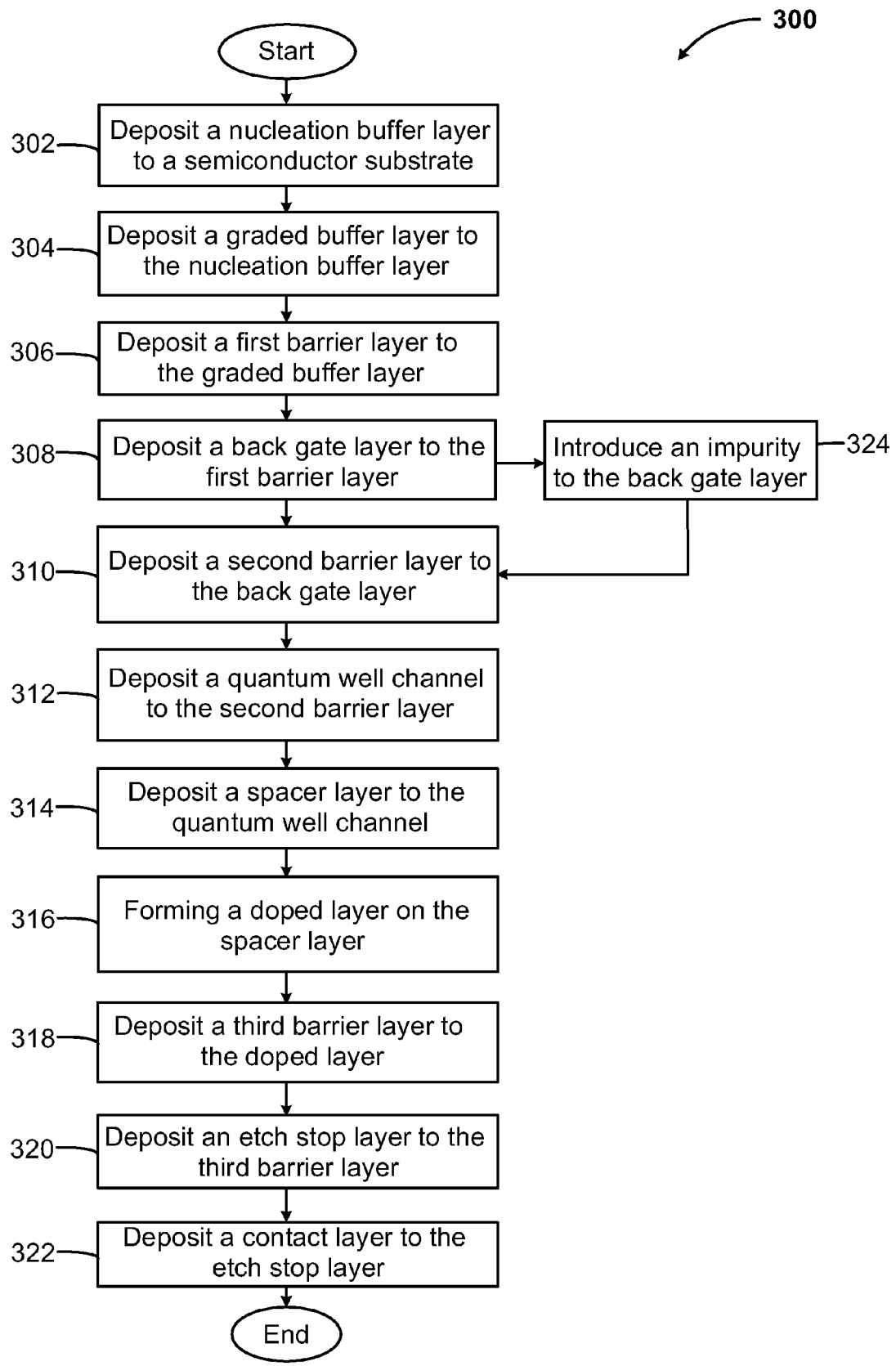
FIG. 3 is a flow diagram of a method for fabricating a semiconductor heterostructure comprising a back gate layer, according to but one embodiment.

FIG. 3 is a flow diagram of a method for fabricating a semiconductor heterostructure comprising a back gate layer, according to but one embodiment. In an embodiment, a method 300 includes depositing a nucleation buffer layer to a semiconductor substrate at box 302, depositing a graded buffer layer to the nucleation buffer layer at box 304, depositing a first barrier layer to the graded buffer layer at box 306, depositing a back gate layer to the first barrier layer at box 308, depositing a second barrier layer to the back gate layer at box 310, and depositing a quantum-well channel to the second barrier layer at box 312. A method 300 may also include introducing an impurity or dopant to the back gate layer 324. A method 300 may further include depositing a spacer layer to the quantum-well channel at box 314, forming a doped layer on the spacer layer at box 316, depositing a third barrier layer to the doped layer at box 318, depositing an etch stop layer to the third barrier layer at box 320, and depositing a contact layer to the etch stop layer at box 322.

Depositing a back gate layer to the first barrier layer 308 may include depositing a back gate layer comprising group III-V semiconductor material and/or group II-VI semiconductor material, or combinations thereof, wherein the back gate layer comprises a first bandgap. The first bandgap may be relatively smaller than a bandgap for the first barrier layer. Depositing a back gate layer 308 may include depositing a thickness of about 10 nm to about 1000 nm. In an embodiment, depositing a back gate layer 308 allows modulation of charge carrier density in a quantum-well channel to decrease short-channel effects of a transistor or other electronic device that incorporates the back gate layer.

In an embodiment, method 300 includes introducing an impurity to the back gate layer 324 including n-type dopants. In another embodiment, introducing an impurity 324 comprises introducing sufficient n-type dopant to allow or increase electric field control across the quantum-well channel via the back gate. Introducing an impurity 324 may be accomplished by an implant process or any other suitable method.

Depositing a second barrier layer to the back gate layer 310 may include depositing a second barrier layer comprising group III-V semiconductor material and/or group II-VI semiconductor material, or combinations thereof, wherein the second barrier layer comprises a second bandgap that is relatively larger than the first bandgap. In an embodiment, depositing a second barrier layer 310 includes depositing a thickness of about 1 nm to about 30 nm. In another embodiment, depositing a second barrier layer 310 includes depositing a material of sufficient thickness to provide a second bandgap that prevents electron tunneling or leakage, or combinations thereof, between the quantum-well channel and the back gate layer.

Depositing a quantum-well channel to the second barrier layer 312 may include depositing a quantum-well channel comprising a third bandgap that is relatively smaller than the second bandgap. Depositing the back gate layer 308, depositing the second barrier layer 310, and/or depositing the quantum-well channel 312 may comprise depositing by molecular beam epitaxy (MBE), atomic layer epitaxy (ALE), epitaxial growth, chemical beam epitaxy (CBE), metal-organic chemical vapor deposition (MOCVD), or combinations thereof. Such deposition techniques may be used for other deposition actions of method 300. In other embodiments, other suitable deposition techniques are used for the deposition actions of method 300.

A method 300 may further include depositing a spacer layer to the quantum-well channel 314, forming a doped layer on the spacer layer 316, depositing a third barrier layer to the doped layer 318, depositing an etch stop layer to the third barrier layer 320, and depositing a contact structure to the etch stop layer 322. Forming a doped layer on the spacer layer 316 may include depositing a semiconductor material to the spacer layer and doping the semiconductor material with an impurity.

Method 300 and associated actions may further include other semiconductor fabrication processes, such as lithography, etch, thin films deposition, planarization, diffusion, metrology, or any other associated action with semiconductor fabrication. In one or more embodiments, method 300 includes embodiments already described with respect to FIGS. 1-2.

Various operations may be described as multiple discrete operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

Figure 4:
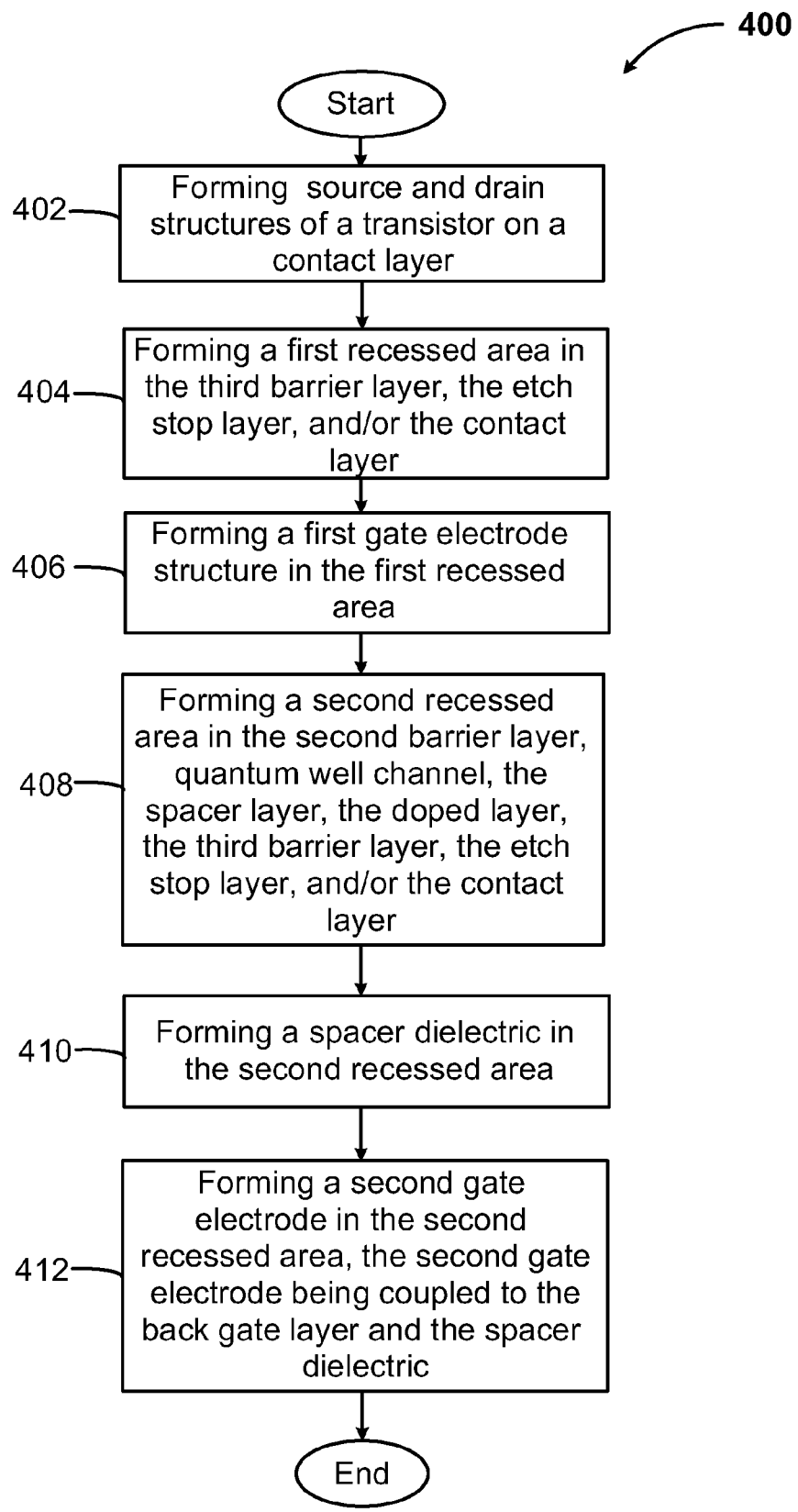
FIG. 4 is a flow diagram of a method for fabricating an electronic device comprising a semiconductor heterostructure, according to but one embodiment.

FIG. 4 is a flow diagram of a method for fabricating an electronic device comprising a semiconductor heterostructure, according to but one embodiment. In an embodiment, a method 400 includes forming source and drain structures of a transistor on a contact layer at box 402, forming a first recessed area in the third barrier layer, the etch stop layer, and/or the contact layer at box 404, forming a first gate electrode structure in the first recessed area at box 406, forming a second recessed area in the second barrier layer, the quantum-well channel, the spacer layer, the doped layer, the third barrier layer, the etch stop layer, and/or the contact layer at box 408, forming a spacer dielectric in the second recessed area at box 410, and forming a second gate electrode in the second recessed area, the second gate electrode being coupled to the back gate layer and the spacer dielectric at box 412.

Forming a first recessed area 404 may comprise etching out a region of the third barrier layer, the etch stop layer, and/or the contact layer. Forming a first gate electrode structure in the first recessed area 406 may comprise depositing a first gate dielectric and a first gate electrode to the first recessed area. Forming a second recessed area 408 may comprise etching out a region of the second barrier layer, quantum-well channel, the spacer layer, the doped layer, the third barrier layer, the etch stop layer, and/or the contact layer. Hardmask may be patterned to protect regions of an electronic device from an etch process that forms second recessed area 408. Forming a spacer dielectric in the second recessed area 410 may comprise depositing and etching a spacer dielectric material, such as silicon nitride or any other suitable dielectric material. Forming a second gate electrode 412 may comprise depositing a metal to contact the back gate layer wherein the spacer dielectric electrically isolates the second gate electrode from the quantum-well channel.

Method 400 and associated actions may further include other semiconductor fabrication processes, such as lithography, etch, thin films deposition, planarization, diffusion, metrology, or any other associated action with semiconductor fabrication. In one or more embodiments, method 400 includes embodiments already described with respect to FIGS. 1-3.

Various operations may be described as multiple discrete operations in turn, in a manner that is most helpful in understanding the claimed subject matter. The order of description should not, however, be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

Figure 5:
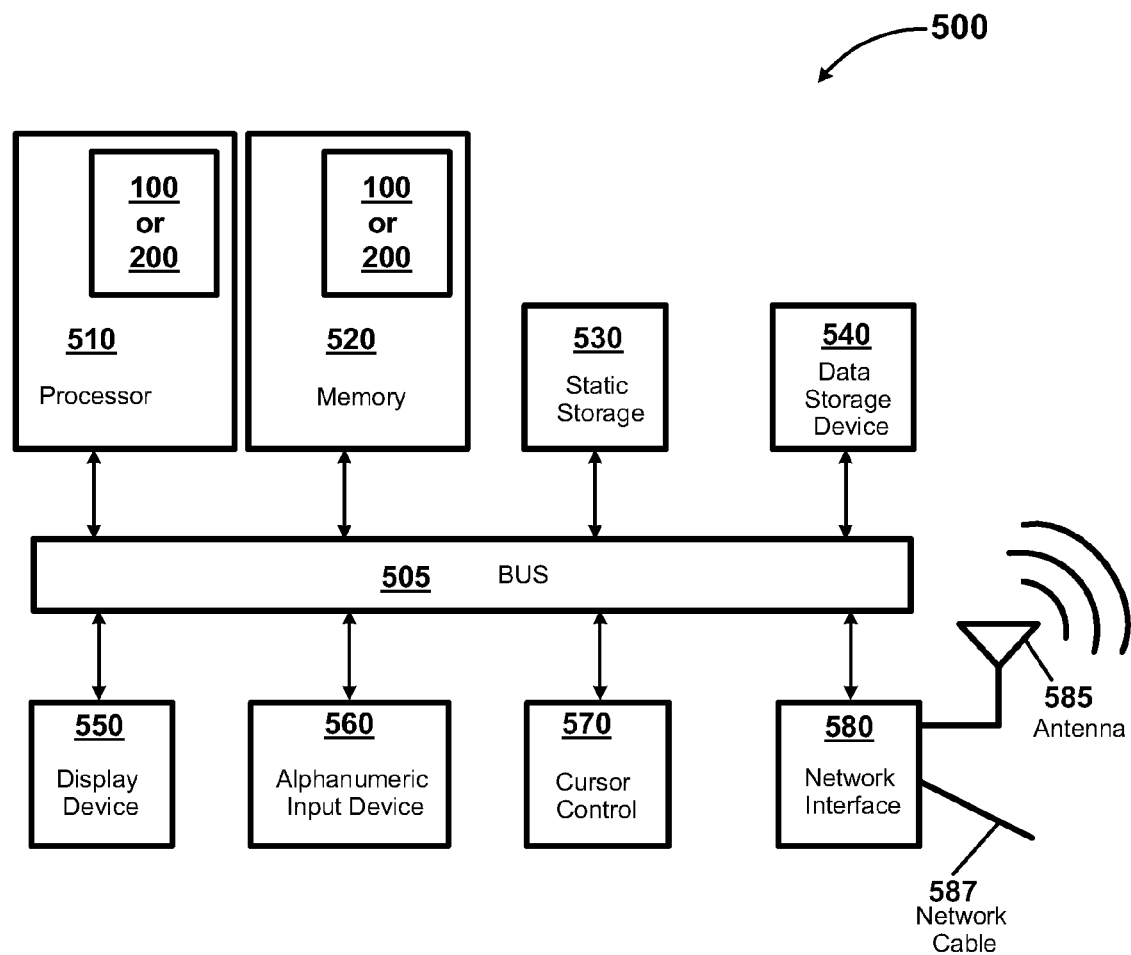
FIG. 5 is a diagram of an example system in which a semiconductor heterostructure or electronic device as described herein may be used, according to but one embodiment.

FIG. 5 is a diagram of an example system in which a semiconductor heterostructure or electronic device as described herein may be used, according to but one embodiment. System 500 is intended to represent a range of electronic systems (either wired or wireless) including, for example, desktop computer systems, laptop computer systems, personal computers (PC), wireless telephones, personal digital assistants (PDA) including cellular-enabled PDAs, set top boxes, pocket PCs, tablet PCs, DVD players, or servers, but is not limited to these examples and may include other electronic systems. Alternative electronic systems may include more, fewer and/or different components.

In one embodiment, electronic system 500 includes a semiconductor heterostructure 100 or electronic device 200 as described herein. In an embodiment, a semiconductor heterostructure 100 or electronic device 200 as described herein is part of an electronic system's processor 410 or memory 420. Electronic system 500 may include a processor 510 and memory 520 coupled with the processor 510, wherein the processor 510 or the memory 520, or combinations thereof, comprise one or more transistors formed in a semiconductor heterostructure 100. In an embodiment, the processor 510 or the memory 520, or combinations thereof, comprise a p-type metal-oxide-semiconductor (PMOS) electronic device 200 or an n-type metal-oxide-semiconductor (NMOS) electronic device 200.

Electronic system 500 may include bus 505 or other communication device to communicate information, and processor 510 coupled to bus 505 that may process information. While electronic system 500 may be illustrated with a single processor, system 500 may include multiple processors and/or co-processors. In an embodiment, processor 510 includes a semiconductor heterostructure 100 or electronic device 200 in accordance with embodiments described herein. System 500 may also include random access memory (RAM) or other storage device 520 (may be referred to as memory), coupled to bus 505 and may store information and instructions that may be executed by processor 510.

Memory 520 may also be used to store temporary variables or other intermediate information during execution of instructions by processor 510. Memory 520 is a flash memory device in one embodiment. In another embodiment, memory 520 includes a semiconductor heterostructure 100 or electronic device 200 as described herein.

System 500 may also include read only memory (ROM) and/or other static storage device 530 coupled to bus 505 that may store static information and instructions for processor 510. Data storage device 540 may be coupled to bus 505 to store information and instructions. Data storage device 540 such as a magnetic disk or optical disc and corresponding drive may be coupled with electronic system 500.

Electronic system 500 may also be coupled via bus 505 to display device 550, such as a cathode ray tube (CRT) or liquid crystal display (LCD), to display information to a user. Alphanumeric input device 560, including alphanumeric and other keys, may be coupled to bus 505 to communicate information and command selections to processor 510. Another type of user input device is cursor control 570, such as a mouse, a trackball, or cursor direction keys to communicate information and command selections to processor 510 and to control cursor movement on display 550.

Electronic system 500 further may include one or more network interfaces 580 to provide access to network, such as a local area network. Network interface 580 may include, for example, a wireless network interface having antenna 585, which may represent one or more antennae. Network interface 580 may also include, for example, a wired network interface to communicate with remote devices via network cable 587, which may be, for example, an Ethernet cable, a coaxial cable, a fiber optic cable, a serial cable, or a parallel cable.

In one embodiment, network interface 580 may provide access to a local area network, for example, by conforming to an Institute of Electrical and Electronics Engineers (IEEE) standard such as IEEE 802.11b and/or IEEE 802.11g standards, and/or the wireless network interface may provide access to a personal area network, for example, by conforming to Bluetooth standards. Other wireless network interfaces and/or protocols can also be supported.

IEEE 802.11b corresponds to IEEE Std. 802.11b-1999 entitled "Local and Metropolitan Area Networks, Part 11: Wireless LAN Medium Access Control (MAC) and Physical Layer (PHY) Specifications: Higher-Speed Physical Layer Extension in the 2.4 GHz Band," approved Sep. 16, 1999 as well as related documents. IEEE 802.11g corresponds to IEEE Std. 802.11g-2003 entitled "Local and Metropolitan Area Networks, Part 11: Wireless LAN Medium Access Control (MAC) and Physical Layer (PHY) Specifications, Amendment 4: Further Higher Rate Extension in the 2.4 GHz Band," approved Jun. 27, 2003 as well as related documents. Bluetooth protocols are described in "Specification of the Bluetooth System: Core, Version 1.1," published Feb. 22, 2001 by the Bluetooth Special Interest Group, Inc. Previous or subsequent versions of the Bluetooth standard may also be supported.

In addition to, or instead of, communication via wireless LAN standards, network interface(s) 580 may provide wireless communications using, for example, Time Division, Multiple Access (TDMA) protocols, Global System for Mobile Communications (GSM) protocols, Code Division, Multiple Access (CDMA) protocols, and/or any other type of wireless communications protocol.

The above description of illustrated embodiments, including what is described in the Abstract, is not intended to be exhaustive or to limit to the precise forms disclosed. While specific embodiments and examples are described herein for illustrative purposes, various equivalent modifications are possible within the scope of the description, as those skilled in the relevant art will recognize.

These modifications can be made in light of the above detailed description. The terms used in the following claims should not be construed to limit the scope to the specific embodiments disclosed in the specification and the claims. Rather, the scope of the embodiments disclosed herein is to be determined by the following claims, which are to be construed in accordance with established doctrines of claim interpretation.

What is claimed is:

1. An apparatus, comprising:
   a semiconductor substrate;
   a first buffer layer formed directly on the semiconductor substrate, the first buffer layer being a nucleation buffer layer formed from GaAs;
   a second buffer layer formed directly on the first buffer layer, the second buffer layer being a graded buffer layer formed from $In_xAl_{1-x}As$, in which x has a value between 0 and 1;
   a first barrier layer formed directly on the second buffer layer;
   a back gate layer formed directly on the first barrier layer, the back gate layer comprising a group III-V semiconductor material, a group II-VI semiconductor material, or combinations thereof, the back gate layer comprising a first bandgap;
   a second barrier layer formed directly on the back gate layer, the second barrier layer comprising a single layer formed from aluminum arsenide (AlAs), the second barrier layer comprising a second bandgap that is relatively larger than the first bandgap;
   a quantum-well channel formed directly on the second barrier layer, the quantum-well channel comprising a third bandgap that is relatively smaller than the second bandgap;
   a spacer layer formed directly on the quantum-well channel;
   a doped layer formed on the spacer layer;
   a third barrier layer formed on the doped layer;
   an etch stop layer formed on the third barrier layer;
   a contact structure formed on the etch stop layer;
   a source structure coupled to the contact structure;
   a drain structure coupled to the contact structure;
   a first gate electrode structure coupled to a first recessed area in the third barrier layer, the etch stop layer, and the contact structure;
   a spacer dielectric structure coupled to a second recessed area in the second barrier layer, quantum-well channel, the spacer layer, the doped layer, the third barrier layer, the etch stop layer, and the contact structure; and
   a second gate electrode structure coupled to the back gate layer and the spacer dielectric structure in the second recessed area,
   the quantum-well channel being a channel of a transistor and the back gate layer allowing modulation of charge carrier density in the quantum-well channel to decrease short-channel effects of the transistor.

2. An apparatus according to claim 1, wherein the back gate layer comprises sufficient n-type dopant to allow electric field control across the quantum-well channel.

3. An apparatus according to claim 1, wherein the back gate layer comprises a thickness of about 10 nm to about 1000 nm, and the second barrier layer comprises a thickness of about 1 nm to about 30 nm.

4. An apparatus according to claim 1, wherein the second bandgap is sufficient to prevent electron tunneling or leakage, or combinations thereof, between the quantum-well channel and the back gate layer.

5. An apparatus according to claim 1, wherein the semiconductor substrate comprises silicon (Si), the first barrier layer comprises indium aluminum arsenide (InAlAs), the back gate layer comprises n-type doped indium gallium arsenide (InGaAs), the quantum-well channel comprises indium gallium arsenide (InGaAs), the spacer layer comprises indium aluminum arsenide (InAlAs), the doped layer comprises silicon (Si), the third barrier layer comprises indium aluminum arsenide (InAlAs), the etch stop layer comprises indium phosphide (InP), and the contact structure comprises indium gallium arsenide (InGaAs).

6. A system, comprising:
a processor; and
a memory coupled with the processor, the processor or the memory, or combinations thereof, comprising one or more transistors formed in a semiconductor heterostructure, the semiconductor heterostructure comprising:
a semiconductor substrate;
a firsts buffer layer formed directly on the semiconductor substrate, the first buffer layer being a nucleation buffer layer formed from GaAs;
a second buffer layer formed directly on the first buffer layer, the second buffer layer being a graded buffer layer formed from $In_xAl_{1-x}As$, in which x has a value between 0 and 1;
a first barrier layer formed directly on the second buffer layer;
a back gate layer formed directly on the first barrier layer, the back gate layer comprising a group III-V semiconductor material, a group II-VI semiconductor material, or combinations thereof, the back gate layer comprising a first bandgap;
a second barrier layer formed directly on the back gate layer, the second barrier layer comprising a single layer formed from aluminum arsenide (AlAs), a group II-VI semiconductor material, or combinations thereof, the second barrier layer comprising a second bandgap that is relatively larger than the first bandgap;
a quantum-well channel formed directly on the second barrier layer, the quantum-well channel comprising a third bandgap that is relatively smaller than the second bandgap;
a spacer layer formed directly on the quantum-well channel;
a doped layer formed on the spacer layer;
a third barrier layer formed on the doped layer;
an etch stop layer formed on the third barrier layer;
a contact structure formed on the etch stop layer;
a source structure coupled to the contact structure;
a drain structure coupled to the contact structure;
a first gate electrode structure coupled to a first recessed area in the third barrier layer, the etch stop layer, and the contact structure;
a spacer dielectric structure coupled to a second recessed area in the second barrier layer, quantum-well channel, the spacer layer, the doped layer, the third barrier layer, the etch stop layer, and the contact structure; and
a second gate electrode structure coupled to the back gate layer and the spacer dielectric structure in the second recessed area,
the quantum-well channel being a channel of a transistor and the back gate layer allowing modulation of charge carrier density in the quantum-well channel to decrease short-channel effects of the transistor.

7. A system according to claim 6, wherein the processor or the memory, or combinations thereof, comprise a p-type metal-oxide-semiconductor (PMOS) device or an n-type metal-oxide-semiconductor (NMOS) device, wherein the back gate layer comprises sufficient n-type dopant to allow electric field control across the quantum-well channel.

8. A system according to claim 6, wherein the back gate layer comprises a thickness of about 10 nm to about 1000 nm, and the second barrier layer comprises a thickness of about 1 nm to about 30 nm.

9. A system according to claim 6, wherein the second bandgap comprises sufficient to prevent electron tunneling or leakage, or combinations thereof, between the quantum-well channel and the back gate layer.

10. A system according to claim 6, wherein the semiconductor substrate comprises silicon (Si), the back gate layer comprises n-type doped indium gallium arsenide (InGaAs), the quantum-well channel comprises indium gallium arsenide (InGaAs), the spacer layer comprises indium aluminum arsenide (InAlAs), the doped layer comprises silicon (Si), the third barrier layer comprises indium aluminum arsenide (InAlAs), the etch stop layer comprises indium phosphide (InP), and the contact structure comprises indium gallium arsenide (InGaAs).

* * * * *